United States Patent [19]
Meier

[11] 3,959,784
[45] May 25, 1976

[54] HIGH SPEED OPTICAL READ-OUT OF DATA STORED IN AN ARRAY

[75] Inventor: Michael J. Meier, Monrovia, Calif.

[73] Assignee: Actron, Monrovia, Calif.

[22] Filed: Dec. 23, 1974

[21] Appl. No.: 535,364

[52] U.S. Cl. .................... 340/173 LM; 340/173 LT
[51] Int. Cl.² .................... G11C 7/00; G11C 13/04
[58] Field of Search ............... 340/173 LM, 173 LT, 340/173 CR; 350/3.5

[56] References Cited
UNITED STATES PATENTS

3,737,878   6/1973   Gamblin et al. ............. 340/173 LM

OTHER PUBLICATIONS

Harris, Optical Tape Read–Only Storage System, IBM Technical Disclosure Bulletin, Vol. 10, No. 12, 5/68, pp. 1868–1869.
Pohl, Holographic Memory With Rapid Access, IBM Technical Disclosure Bulletin, Vol. 15, No. 5, 10/72, p. 1557.
Yamaoka et al., Photodetector Array for a Holographic Optical Memory System, Fujitsu Sci. & Tech. J. (Japan), Vol. 8, No. 3, 9/72, pp. 137–138.
Smith, Large Capacity Holographic Memory, IBM Technical Disclosure Bulletin, Vol. 15, No. 3, 8/72, p. 767.

*Primary Examiner*—Stuart N. Hecker
*Attorney, Agent, or Firm*—Marvin H. Kleinberg

[57] ABSTRACT

Data is stored in frames of fixed format at successive intervals along a ribbon or photographic film. Synchronizing marks on the storage medium indicate the location of each data frame and detection of each successive synchronizing mark triggers a light source which illuminates the film with successively different wavelengths of radiant energy. Successive data frames of the successive wavelengths or colors are imaged on successive detector arrays, each detector array having its elements arranged in a pattern similar to the format of the data. When all the detector arrays have been used, the cycle of colors and of detector arrays is repeated. The detector arrays consist of photodiodes operated in the charge storage mode. After exposure, the elements of the arrays are sampled in a predetermined sequence based on the format of the data, to produce the desired high speed output data signal. Thus, the limited read-out speed of the detector arrays is not a limitation on the present system because such read-out is carried out in parallel by use of a number of arrays into which the data has been optically demultiplexed. The stored data may be in either amplitude modulated or holographic form.

27 Claims, 15 Drawing Figures

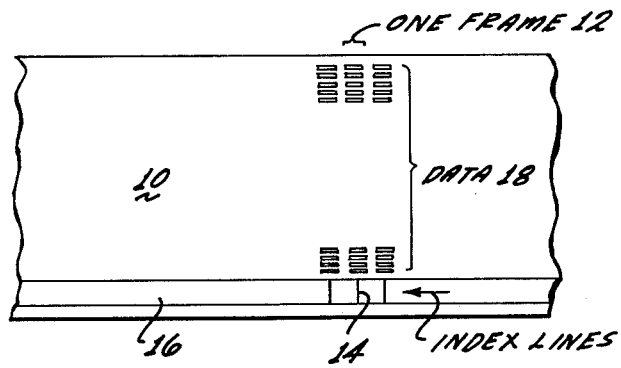
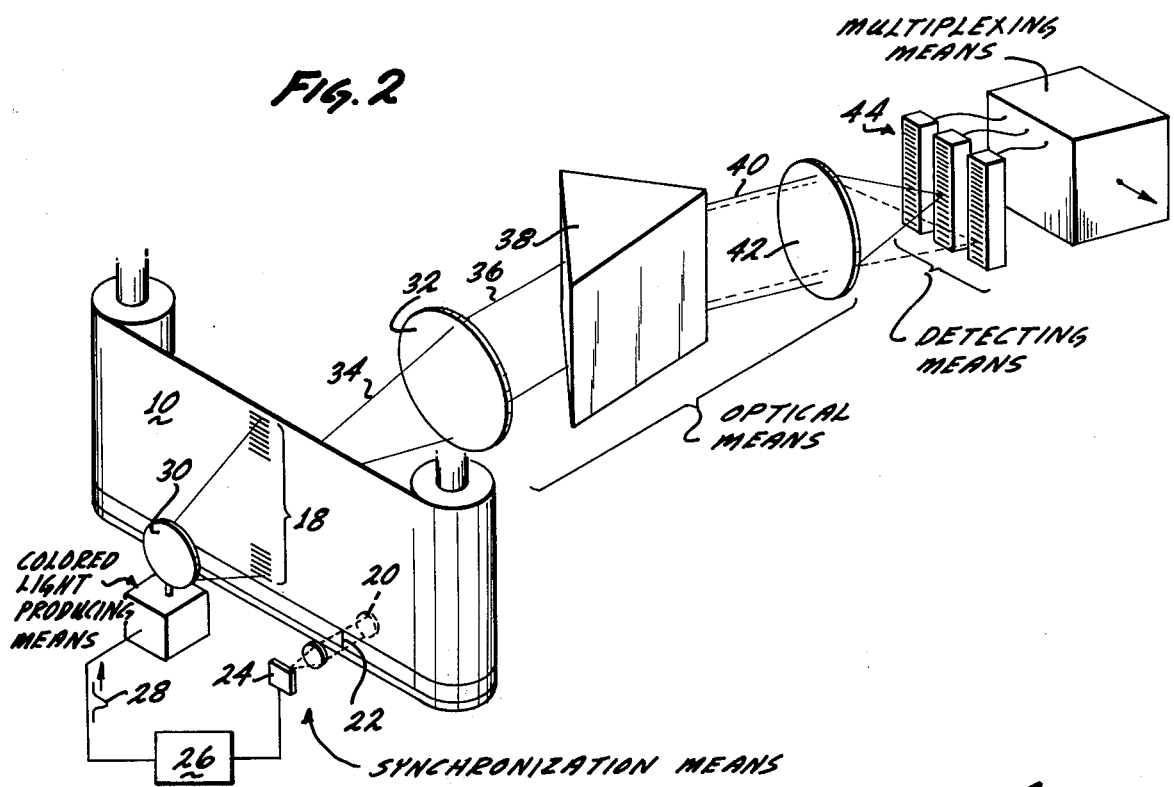
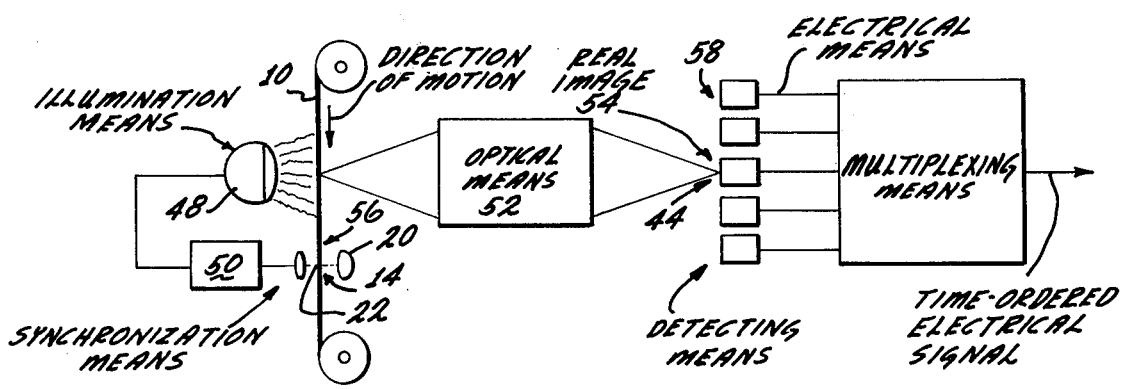

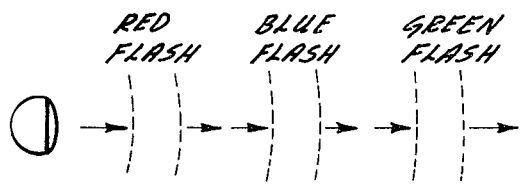
Fig. 3a
A SINGLE SOURCE WHICH EMITS LIGHT OF SEVERAL COLORS
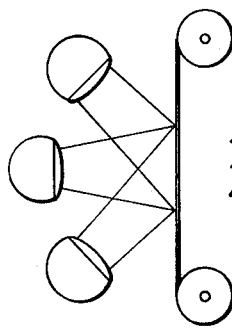
Fig. 3b
ILLUMINATION BY SOURCE OF DIFFERENT COLORS
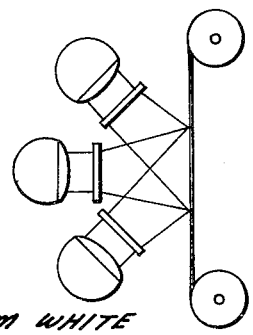
Fig. 3c
LIGHT FROM WHITE LIGHT SOURCES FILTERED TO PRODUCE ILLUMINATING BEAMS OF VARIOUS COLORS
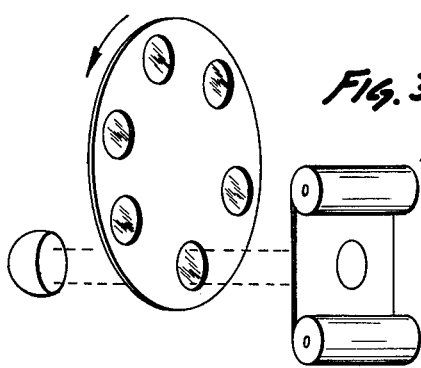
Fig. 3d
USE OF A COLOR FILTER WHEEL WITH A WHITE LIGHT SOURCE TO PRODUCE FLASHES OF LIGHT OF VARIOUS COLORS
Fig. 3e
LIGHT FROM A DYE-LASER RAPIDLY INDEXED FROM ONE WAVELENGTH TO ANOTHER
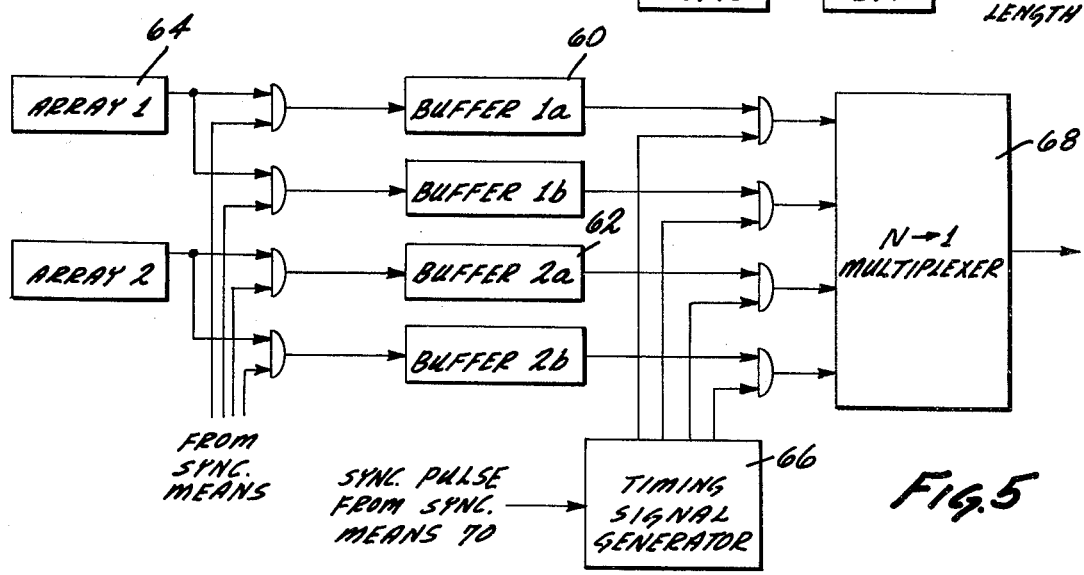
Fig. 5

FIG. 6

```
                        TIMING →
                   λ1 λ2 λ3 λ4 λ1 λ2 λ3 λ4 λ1 λ2 λ3 λ4 λ1
LIGHT BURSTS       |  |  |  |  |  |  |  |  |  |  |  |  |

READ ARRAY 1 INTO BUFFER 1a

READ BUFFER 1b

READ ARRAY 1 INTO BUFFER 1b

READ BUFFER 1a

READ ARRAY 2 INTO BUFFER 2a

READ BUFFER 2b
```

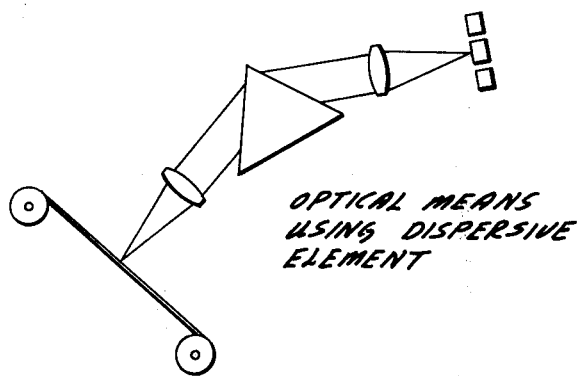

FIG. 7a — OPTICAL MEANS USING DISPERSIVE ELEMENT

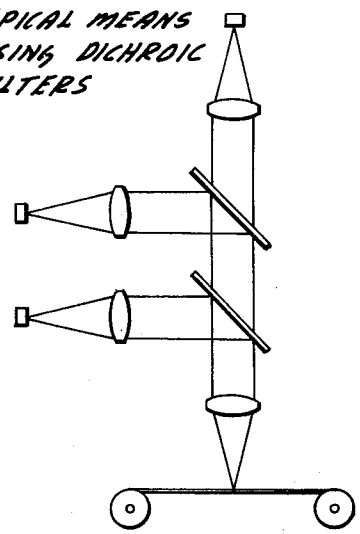

FIG. 7b — OPTICAL MEANS USING DICHROIC FILTERS

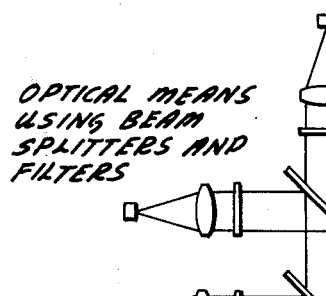

FIG. 7c — OPTICAL MEANS USING BEAM SPLITTERS AND FILTERS

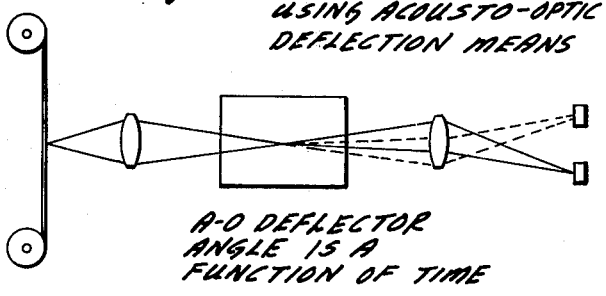

FIG. 7d — OPTICAL MEANS USING ACOUSTO-OPTIC DEFLECTION MEANS

A-O DEFLECTOR ANGLE IS A FUNCTION OF TIME

HIGH SPEED OPTICAL READ-OUT OF DATA STORED IN AN ARRAY

BACKGROUND OF THE INVENTION

1. Field of the Invention

This invention relates to data processing and more particularly the reading out at very high speed of data recorded on a film in the form of discrete levels of optical density located in a known format.

2. Description of the Prior Art

Prior art is described in U.S. Pat. No. 3,584,147, issued June 8, 1971, to Flory, in which successive frames are illuminated in time sequence by a strobe lamp of one color, while light of a different color is used for the synchronization signals, to eliminate cross-talk between the synchronization channel and the data channel.

A read-out system using spaced spots of light of different colors is described by Harris in IBM Technical Disclosure Bulletin, Volume 10, No. 12, May, 1968, page 1868, to sense the optical density at different points in the data frame. Harris assigns a separate color to each row of data and the rows are read by motion of a series of colored spots across the film. For each color channel there is provided one detector cell, part of an array of detector cells.

Corcoran, U.S. Pat. No. 3,739,154, issued June 12, 1973, contemplates the simultaneous scan of a plurality of recorded tracks in a recording medium during read-out. Corcoran's invention resembles Harris' in that a separate detector cell is assigned to each row of data, and the rows are scanned simultaneously by motion of the light spot across the film.

Ketchledge, U.S. Pat. No. 3,099,820, issued July 30, 1963, reads data stored in the form of transparent colored squares on a film using a single detector array. A cathode ray tube is used to generate a sequence of colors for illuminating the film.

The patent to Weimer, U.S. Pat. No. 3,696,250, issued Oct. 3, 1972, describes a system for transferring the information from sensor elements into an output circuit where the elements are part of a two-dimensional array. Weimer does not suggest the desirability of combining his information transfer technique with an optical film reading system and does not hint at the advantages such a combination would possess if used for film reading.

Thus, although the prior art abounds with systems for reading data stored on film, it will be seen below that the present invention uses a novel approach and is capable of achieving higher speed.

SUMMARY OF THE INVENTION

Black and white photographic film is a good medium for the storage of binary data in computer and data-processing applications, because the high resolution of film permits a great amount of data to be stored in a rather limited area of film. This in turn makes for ease and convenience in handling and storing the binary data.

The main problem with photographic storage is to read out the information rapidly so that it can be used on stream by a high speed computer. If the data cannot be read out with sufficient speed the computer will have to wait for the data and the advantage of the high speed computer is wasted.

Typically, a number of spaces are reserved on the film and each space may be opaque or nonopaque, corresponding to the binary characters "0" and "1". Typically, these spaces are arranged in some predetermined pattern and means are supplied on the film to index the spaces with respect to the read-out system. Alternatively, holographic storage may be used, wherein phase information recorded on the film is combined with a reference beam to produce amplitude variations at the detector surface.

In the embodiments described below, it is assumed that successive spaces on the film are arranged in "frames." This is not to imply that the film is transported by a series of intermittent motions, but instead connotes only that the frame regions can be indexed, illuminated, and processed individually as a series of successive images.

In the present invention, successive frames are illuminated by light of different wavelengths. An optical system is provided, which images the successive frames on successive photodetector arrays. The color of light being used for illumination determines which array the image of the frame is formed on, and as many detector arrays are used as there are colors. Thus, the data is demultiplexed from the film to a plurality of photodetector arrays. This is a point of distinction between the present invention and the inventions of Harris and Corcoran. In those inventions, a single multi-detector array is used having one detector for each row of data, whereas Applicant's invention provides a separate detector cell for each element of data in a frame. In the prior art the rows are scanned simultaneously by a single sweep of the images of the rows across the detector array. During this scanning process, each detector must respond to the train of data recorded in its row and thus each detector is "on-stream" continually during the scan. For this reason, charge storage mode detectors cannot be used with the inventions of Harris and Corcoran.

In the present invention, each array consists of a number of photodetector cells integrated on a substrate and includes electrical means integrated on the same substrate to enable the individual cells of the array to be sampled in sequence at a predetermined rate determined by an external clock. With each increment of the clock, a new cell is sampled; the clock rate is the number of cells sampled per second.

The light falling on a detector cell sets up an electrical charge distribution which remains until that cell is sampled. The sequential sampling of the cells results in an electrical output signal consisting of a time-ordered sequence of pulses for use by a computer or other instrument. This technique for generating a single stream of data is not suggested by Harris or Corcoran. Weimer teaches a technique for reading data out of a two-dimensional detector array, but does not suggest the desirability of combining his information transfer technique with an optical film reading system and does not hint at the advantages such a combination would have if used for film reading.

At the present state of the art, film transport speeds of several hundred inches per second are possible. If each frame consists of a space one mil in length along the film, several hundred thousand frames per second would be available for reading. However, at the present state of the art, the frame rate of detector arrays is measured in tens of thousands of frames per second.

If a single array were used, the speed of the readout system would be limited by the frame rate of the array. To circumvent this limitation and to more nearly balance the limitations of the components of the system, the present invention provides a way of imaging successive film frames onto successive detector arrays. Ideally, electrical read-out of the first array is completed just as the last array is being exposed.

BRIEF DESCRIPTION OF THE DRAWINGS

An object of the present invention is to provide a system for rapidly extracting or retrieving information stored on a film.

The invention itself, as well as further objects and advantages thereof, will best be understood from the following detailed description of an illustrative embodiment, read in conjunction with the accompanying drawings, wherein FIG. 1 illustrates the format of the data on the film.

FIG. 2 is a schematic diagram of a preferred embodiment of the invention.

FIG. 3, including 3a through 3e, show alternative colored light producing means.

FIG. 4 is a generalized schematic of the system.

FIG. 5 shows an alternative multiplexing technique.

FIG. 6 shows the timing of operations in the alternative multiplexing technique; and FIG. 7, including 7a through 7d, shows several alternative optical means.

DESCRIPTION OF THE PREFERRED EMBODIMENTS

The arrangement of the recorded data on the film may take many forms and still be compatible with the preferred embodiment, however, for purposes of description, a concrete example will be used. As shown in FIG. 1, the data 18 is recorded on a continuous length of black and white photographic film 10. The data is grouped into frames.

Each frame 12 consists of a column of rectangular spaces having their longer dimension lengthwise of the film. The center of each frame is marked by a narrow index line of which 14 is typical, crosswise of the film and contained in a special channel which runs along one edge of the film. Each of the rectangular spaces is a datum and is either opaque or nonopaque corresponding to the binary digits 1 and 0.

The dimension of each of these spaces typically is less than 1 mil wide and several mils in length along the film. The number of binary digits or bits stored in this fashion, side-by-side at a location indexed by the index line, is some binary number of bits. The spacing of the bits across the film is determined by the resolution of the recording, film, optical readout system, and the system signal to noise desired.

The length of each bit in the direction along the film is determined by the speed of movement of the film relative to the dwell time of the data recording and data read-out processes. Thus, the lateral spacing of the bits across the film is determined by the spatial resolving power while the length of the bits on the film is determined by the temporal resolving power of the system.

As shown in FIG. 2, a continuous light source 20 is used to illuminate the index lines on the film. Baffling may be used to prevent this light from falling on the data-carrying part 18 of the film 10. Alternatively, the wavelengths of the light used to illuminate the index pulses may be different from the wavelengths used in reading the information tracks on the film and hence eliminating the possibility of such light cross-modulating the data read-out. Each index line is detected by a photoelectric detector 24 which in turn through an electronic system 26 generates a synchronization pulse 28. Such pulses are used to trigger short pulses of a source of light 30 which is capable of emitting a cyclical sequence of colors.

Alternatively, the synchronization electronics may generate a series of pulses addressed serially to a number of light sources of different colors, which are used in sequence to illuminate the data frames on the film. Other alternative embodiments include one or more flashing light sources with a series of filters interposed between the sources and the film, as shown in FIG. 3.

Each frame on the film is illuminated once only. It is immaterial which color is used to illuminate a particular frame provided the cyclical sequence is maintained. In the preferred embodiment the light used to illuminate the data tracks on the film is directed through the film and into an optical system on the otherside of the film.

As shown in FIG. 2, the optical system consists of a lens 32 spaced from the film a distance such that its focal plane lies on the film and located along the film so that it is perpendicular to the film at the location of the frame corresponding to the index line being read. The purpose of this lens 32 is to convert the diverging bundle of rays 34 emerging from a point on the film into a collimated bundle of rays 36 so that all the light passing through a data frame on the film has essentially the same direction as it enters the spectral dispersing portion of the optics.

The dispersing portion of the optics, in the preferred embodiment consists of a prism 38, whose index of refraction varies with wavelength. Because of this dispersive effect, light of different wavelengths will leave the prism in different directions, and therefore the parallel bundle of rays leaving the prism 40 will have a direction dependent on the wavelength used.

A second lens 42 is interposed in the optical path following the prism and relative to this lens the light appears to come from one of a number of apparent point sources located at infinity, the apparent direction of the source depending on its color. Therefore, this apparent source at infinity will be imaged by the second lens in its focal plane at various points depending on which color is used to illuminate the data tracks.

It should be noted that the prism disperses the light only in one direction, namely in a plane perpendicular to the faces of the prism. Consequently, a line running crosswise of the film would be imaged by the second lens into a line and not a curve, despite the fact that light from different points along the line on the film necessarily enter the prism at some inclination with respect to the plane perpendicular to its faces. There will, however, be some distortion of the spacing between points on a line running lengthwise of the film. Light from these points necessarily enters the prism at various angles with respect to the face of the prism, and therefore light from these points is not deviated through the same angle by the prism. As a result, the image formed by the second lens is distorted in the direction along the film, although the image will still be sharp at any instant. The distortion is not a serious problem in practice and it combines with the blur produced by motion of the film during the illumination time. Both of these effects may be remedied by designing the width of the detector array to be slightly greater than what it would be in the absence of these effects.

In the image plane of the second lens are located a number of linear or area detector arrays of which 44 is typical—one for each wavelength of light being used. The arrays operate in a charge-storage mode which means that once the image is flashed briefly upon the array, it responds to the image light illumination to generate a distribution of electrical charge on the surface of the array. This distribution of charge remains relatively fixed until it is read out electrically.

The operation of the preferred embodiment of the read-out system is shown in FIG. 4. As the index line 14 on the film moves past the light source 20 it is detected by the index line detector 24 which in turn generates a signal to the synchronization electronics circuit 50. Together, the light source, detector and electronics circuit comprise the synchronization means in the preferred embodiment. This circuit causes the illuminating means 48 to flash light of 1 wavelength, illuminating the frame corresponding to the index line on the film. The image 54 of the frame is routed by the optical means 52 to one of the charge-storage mode photodiode arrays of which 44 is typical; the particular array is determined by the color of the light used to illuminate the data tracks. The plurality of arrays comprise the detecting means in the preferred embodiment.

After being illuminated by the image of a data frame, the cells in an array are sampled in sequence. This sampling is produced by an external clock, part of the multiplexing means, which gates the electrical contents of each cell in its turn into an output bus.

As the film continues to move, the next index line 56 is detected and a different color of light is used to illuminate the next frame. Because a different color was used, the second frame will be imaged on a different linear array such as 58. This process is repeated until all the available wavelengths have been used; thereafter, the cyclical sequence of wavelengths is repeated.

If there are $k$ wavelengths, each wavelength will be used to illuminate only each kth frame on the film. Consequently, the charge-storage mode photodiode array corresponding to that wavelength will receive an image only once for each $k$ frames on the film. This permits the data stored on a particular photodiode array to be read out electrically in serial form during the $k$ record times.

Because the detecting arrays are operated in the charge-storage mode, it is possible to use the storage ability of the array to hold the data until called for by the multiplexer. This can be accomplished by reading only one bit at a time from each successive array into the multiplexer. This implies a specific format for the data on the film. With this scheme, if there are $k$ arrays, the rate at which bits must be read out of the arrays is equal to the output data rate divided by $k$.

This same result would be obtained if an alternative technique were used for reading the data out of the arrays. In the alternative embodiment shown in FIG. 5 two buffer storage devices such as 60 and 62 are used in association with each detecting array 64. While the contents of an array are being read into one buffer, the contents of the other buffer are being read out of it into a multiplexer. The timing of these operations is controlled by the timing synchronization pulses 70 generated when the index lines are detected by the synchronization means. The timing is further shown in FIG. 6.

The multiplexer samples the buffers in the sequence $1b, 2b, 3b \ldots nb, 1a, 2a, 3a, \ldots na, 1b, 2b$, etc. If it is desired to have a final output at the rate of R bits per second, and if K arrays are used, then the minimum permissible rate for reading arrays into the buffers is R/K. Conversely, if the maximum read-out rate of the arrays is A bits per second and if K arrays are used, the maximum final output data rate is KA.

In either embodiment, it is the read-out rate of the photodiode array that proves to be a limitation on the speed with which data may be read out by the system. The maximum information rate can be obtained when each photodiode in the array corresponds to one of the lines or data bits on the film. A numerical example will explore the maximum capabilities of the system at the present state of the art and will give a better insight to the factors influencing system design. If the array clock rate is 20 megahertz and if 10 wavelengths of light are used, and each row of data tracks on the film contain 10 records each, then the maximum data rate is 2 gigabits per second if each record contains 1024 bits. The number of frames that must be read each second is approximately 200,000. This in turn establishes the length of time available to read any particular frame, namely 5 microseconds. Each light source would have to flash 40,000 times per second, and the duration of each flash would have to be less than several microseconds. If each track of data on the film were only 1 mil long measured along the film, the film speed would only have to be on the order of 200 inches per second. This film speed has already been demonstrated at the present state of the art.

In a sense, the film carries its own clock in the form of the index lines which are used to locate the data frames. Nevertheless, it is well known that when such a series of lines is used to trigger events within a system, a certain amount of random variation in the time delays involved in inevitable. In the present system, the random fluctuations in the time delays will result in a small amount of jitter in the location of the image of the information tracks formed on the photodiode arrays. This jitter effect can be minimized by designing the image of the data track length on the film to be longer than the length of each photodiode in the array. This could also be accomplished by the use of a cylindrical lens in the optical system. Another feature of the data record is that the shape is designed to eliminate the effects of dynamic skew of the record at high transport rates.

Although a detailed description has been given for a preferred embodiment of the invention, other embodiments will be obvious to those skilled in the art. If the field of view of the optics were sufficiently large, several frames could be imaged simultaneously on several arrays. This is equivalent to enlarging the definitions of "frame" and "array" to include multiplicities of elements in parallel. However, there is a limit to the field of view, and beyond that limit the use of a time sequence of operations is desirable.

If a time sequence of operations is used, it is not necessary to use light of different colors to route the images to the arrays; a time-variable optical configuration is conceivable as shown in FIG. 7d. If light of different colors is used it is not necessary to use a prism or other dispersive device to route the images to the proper arrays; dichroic mirrors or the combination of beam-splitters and filters would accomplish the same result as shown in FIG. 7. Thus, numerous embodiments are possible within the scope of the present invention and these all have in common the same basic steps or elements which are the kernel of the present invention: imaging data frames on photo-detector arrays operated in a charge-storage mode to demultiplex the data from the film, then sequentially sampling the elements of the arrays to generate an electrical output signal consisting of a time-ordered sequence of pulses for use by a computer or other instrument.

Additional embodiments will be obvious to those skilled in the art. The embodiment described hereinabove, together with those additional embodiments, are considered to be within the scope of the invention.

What is claimed as new is:

1. Read-out apparatus for sensing discrete levels of optical density located at predetermined data locations in a known pattern on a moving film, said pattern of locations being repeated on the film in the direction of motion, and for presenting these levels in the form of a time-ordered electrical signal, comprising:
   a. illuminating means to generate short-duration flashes of light to illuminate the film;
   b. optical means for forming a real image of a data location pattern using the light supplied by said illuminating means;
   c. detecting means located at the real image, disposed to receive the light of the image, having elements located at locations in a pattern substantially matching and corresponding to the pattern of data locations on the film, and producing electrical outputs responsive to the received light;
   d. multiplexing means for successively sampling the electrical outputs of said elements in a predetermined order to form a timeordered electrical signal; and
   e. synchronization means for detecting the location of the pattern of data locations on the moving film and for triggering the flashing of said illuminating means in response to detection of the pattern.

2. Read-out apparatus as recited in claim 1, wherein said detecting means is an array of photodiodes operating in a charge-storage mode.

3. Read-out apparatus as recited in claim 1, wherein multiplexing means further include buffer storage devices cooperating with each detecting means, whereby the electrical outputs are stored prior to being sampled.

4. Read-out apparatus as recited in claim 1 further including more than one detecting means spaced from each other, and wherein said illuminating means further include colored light producing means for illuminating successive data formats with radiation of successively different wavelengths in a predetermined cyclical sequence, and optical means for positioning successive data format images on successive detector means in a predetermined cyclical sequence.

5. Read-out apparatus as recited in claim 4 wherein said multiple wavelength light producing means further include a plurality of light sources each associated with a light filter of a different color.

6. Read-out apparatus as recited in claim 4 wherein said colored light producing means further include a plurality of light sources each capable of emitting light of a different color.

7. Read-out apparatus as recited in claim 4 wherein said colored light producing means further include a light source associated with means for successively interposing filters of various colors between the light source and the film in a predetermined cyclical sequence whereby successive data formats are illuminated by light of different colors in a predetermined cyclical sequence.

8. Read-out apparatus as recited in claim 4, wherein said optical means further include a dispersive optical element whereby light of different colors is deflected in different directions.

9. Read-out apparatus as recited in claim 4, wherein said optical means further include dichroic mirrors.

10. Read-out apparatus as recited in claim 4, wherein said optical means further include beam-splitting mirrors associated with color filters.

11. Read-out apparatus as recited in claim 4, wherein said optical means further include spatially dispersive means controlled in time to address a multiplicity of arrays.

12. A method for sensing discrete levels of optical density located at predetermined data locations in a known pattern on a moving film, said pattern of locations being repeated on the film in the direction of motion, and for presenting these levels in the form of a time-ordered electrical signal, comprising:
   a. detecting the location of the pattern on the moving film;
   b. triggering the flashing of an illumination means in response to the detection of the pattern;
   c. illuminating the film with the flashes of light from the illumination means;
   d. imaging the data location pattern onto a detecting means, whereby the group of electrical outputs indicative of the optical density at predetermined locations in the pattern are developed by the detecting means; and
   e. successively sampling the electrical outputs of the detecting means in a predetermined order to form a time-ordered electrical signal.

13. A method as recited in claim 12 wherein the step of illuminating the film further includes illuminating the film by light of a different color upon each successive triggering until all available colors have been used, after which the color sequence is repeated.

14. A method as recited in claim 12 wherein the imaging step further includes imaging successive frames onto successive detecting means.

15. A method as recited in claim 12, wherein the imaging step further includes imaging successive frames onto detecting means addressed by the wavelength of energy being used.

16. A method as recited in claim 12, wherein the sampling step further includes alternatively storing the electrical outputs of the detector means in one of two buffer storage devices, whereby one device may be sampled while the other device is receiving an input from the detector means.

17. Read-out apparatus for sensing discrete levels of optical density located at predetermined regions in successive frames on a movable film and for presenting these levels in the form of a time-ordered electrical signal, comprising:
   a. synchronization means for sensing when successive frames on the film arrive at a predetermined position and for generating at such times successive signals for initiating the illumination of successive frames;
   b. radiant energy source means for illuminating the successive data frames with pulses of radiant energy of different wavelengths in response to the signals generated by said synchronization means;

c. optical means to form a real image of each successive illuminated frame, the image positions being spatially separated as determined by the wavelength of the radiant energy;

d. a plurality of detecting means, each located at a corresponding one of the successive real images of the successive frames, each disposed to receive the light of the corresponding image and having a plurality of discrete detecting elements located at positions substantially matching one-for-one the predetermined regions of the frames for producing electrical output signals in response to the light; and e. multiplexing means for successively sampling the electrical output signals of the elements of said detector means to form a time-ordered electrical signal.

18. The read-out apparatus of claim 17, wherein said optical means further include a dispersive optical element cooperating with other optical elements to produce spatially separated images.

19. The read-out apparatus of claim 17, wherein said optical means further include dichroic mirrors cooperating with other optical elements to produce spatially separated images.

20. The read-out apparatus of claim 17 wherein said optical means further include beam splitting mirrors and color filters cooperating with other optical elements to produce spatially separated images.

21. The read-out apparatus of claim 17 wherein said optical means include spatially deflecting means controlled as a function of time cooperating with other optical elements to produce spatially separated images.

22. The read-out apparatus of claim 17 wherein each said detecting means is an array of photodetectors operating in a charge-storage mode.

23. The read-out apparatus of claim 17 wherein said colored light producing means further include at least one light source cooperating with light filters of different colors to produce flashes of light of different colors.

24. The read-out apparatus of claim 17 wherein said colored light producing means further include a plurality of light sources, each capable of emitting light of a different color.

25. The read-out apparatus of claim 17 wherein said colored light producing means further include a light source capable of emitting in succession flashes of light of different colors.

26. A method for sensing discrete levels of optical density located at predetermined regions in successive frames on a movable film and for presenting these levels in the form of a time-ordered electrical signal, comprising the steps of:

a. sensing when successive frames on the film arrive at a predetermined position and generating at such times sucessive signals for initiating the illumination of successive frames;

b. illuminating the successive data frames with flashes of light of different colors in response to the signals generated in the sensing step;

c. forming a real image of each successive illuminated frame, the image positions being spatially separated as determined by the color of the light;

d. detecting the light in each predetermined region of each successive frame image and producing a separate electrical output signal for each predetermined region in response to the light;

e. successively sampling the electrical output signals corresponding to each predetermined region, to form a time-ordered electrical signal.

27. The method of claim 26 wherein the detecting step further includes the step of storing the electrical output signals produced in said detecting step until they are successively sampled.

* * * * *